United States Patent [19]
Kim

[11] Patent Number: 6,078,199
[45] Date of Patent: Jun. 20, 2000

[54] NEGATIVELY DELAYED SIGNAL GENERATING CIRCUIT FOR COMPENSATING DUTY RATE

[75] Inventor: Ju-Han Kim, Suwon, Rep. of Korea

[73] Assignee: LG Semicon Co., Ltd., Cheongju, Rep. of Korea

[21] Appl. No.: 09/141,424

[22] Filed: Aug. 27, 1998

[30] Foreign Application Priority Data

Dec. 17, 1997 [KR] Rep. of Korea .................. 97-70074

[51] Int. Cl.[7] .................................................. H03B 19/00
[52] U.S. Cl. .......................... 327/116; 327/119; 327/299; 327/276
[58] Field of Search ................................. 327/291, 293, 327/294, 295, 299, 116, 119, 122, 276, 277, 261, 262, 263

[56] References Cited

U.S. PATENT DOCUMENTS

| | | | |
|---|---|---|---|
| 5,530,387 | 6/1996 | Kim | 327/116 |
| 5,721,501 | 2/1998 | Toyoda et al. | 327/116 |
| 5,767,712 | 6/1998 | Takemae et al. | 327/152 |

*Primary Examiner*—Tuan T. Lam
*Attorney, Agent, or Firm*—Fleshner & Kim, LLP

[57] ABSTRACT

A negatively delayed signal generating circuit for compensating a duty rate of an input signal, wherein the negatively delayed signal has a larger frequency than that of the input signal and a stable duty rate regardless of the duty rate of the input signal, thereby being stably applicable to a memory device requiring a high speed operation.

29 Claims, 4 Drawing Sheets

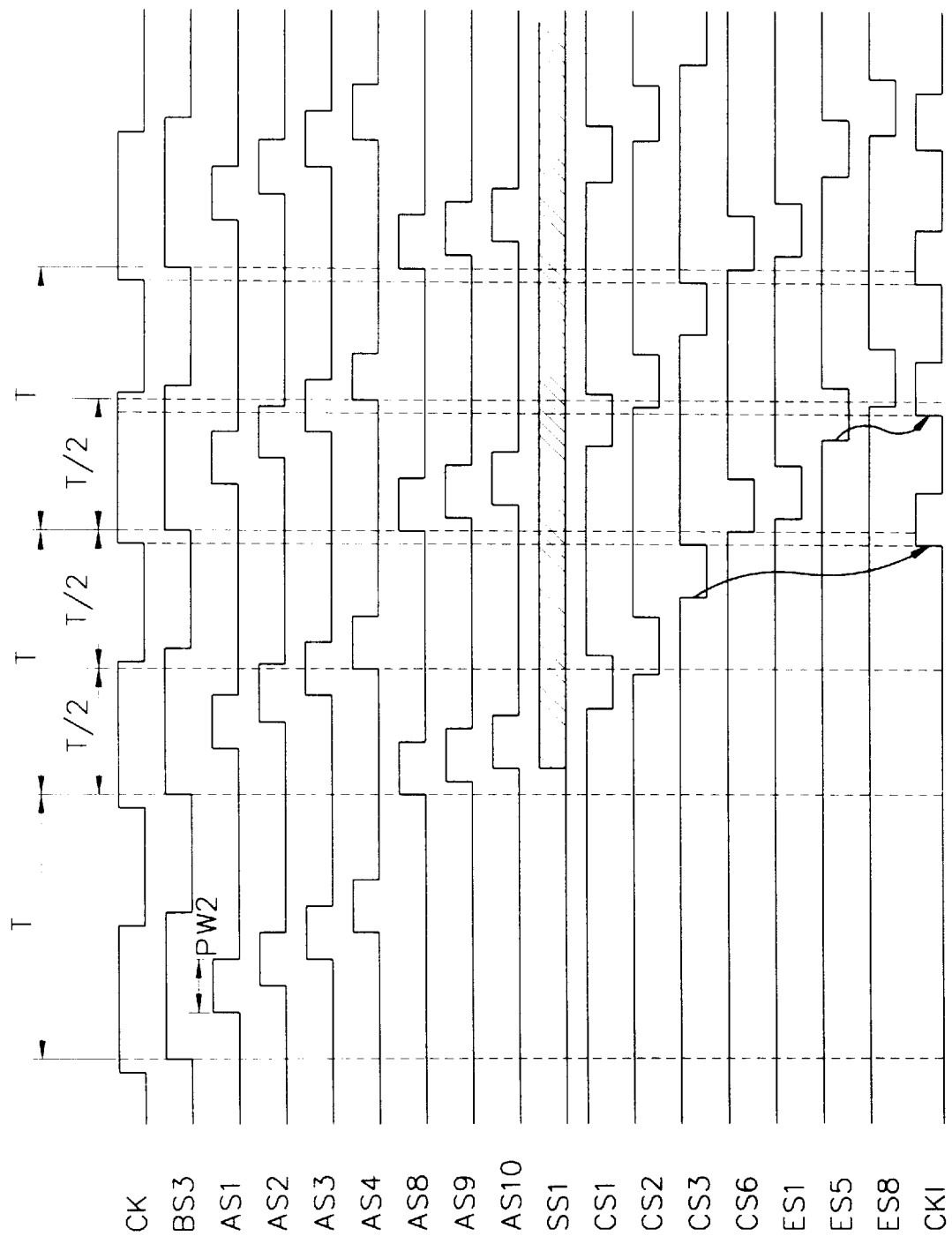

6,078,199

NEGATIVELY DELAYED SIGNAL GENERATING CIRCUIT FOR COMPENSATING DUTY RATE

BACKGROUND OF THE INVENTION

1. Field of the Invention

The present invention relates to a negatively delayed signal generating circuit, and more particularly to an improved negatively delayed signal generating circuit for compensating a duty rate of an input signal.

2. Description of the Background Art

FIG. 1 is a circuit view illustrating a negatively delayed signal generating circuit according to the background art.

As shown therein, the negatively delayed signal generating circuit includes a pulse generator 10 for receiving an input signal CKIN and generating a oneshot pulse signal S1. A first delay unit 11 delays the oneshot pulse signal S1 and outputs a delayed oneshot pulse signal S2. A forward delay unit 12 includes a plurality of delay units for sequentially delaying the delayed oneshot pulse signal 32 output from the first delay unit 11. A mirror control unit 13 includes a plurality of NAND gates for respectively NANDing the oneshot pulse signal S1 and the sequentially delayed oneshot pulse signals, for example S3, output from the plurality of delay units in the forward delay unit 12, thereby outputting signals, for example, a signal S4. A backward delay unit 14 sequentially delays the output signal of the mirror control unit 13 and outputs a signal S5. A dummy load unit 15 receives output signals of the backward delay unit 14 and a ground voltage. A second delay unit 16 delays the output signal S5 of the backward delay unit 14 and outputs a negatively delayed signal CKO.

The pulse generator 10 includes an inverter I1 for inverting the input signal CKIN, a NAND gate ND1 for NANDing the input signal CKIN and the output signal of the inverter 11, and an inverter 12 for inverting the output signal of the NAND gate ND1.

The first delay unit 11 includes inverters 13,14 and buffers B1, B2 which are serially connected with one another.

The forward delay unit 12 includes a plurality of delay units D1, D2, ..., D6 which are serially connected with one another. The delay unit D1 is provided with a NAND gate ND2 for NANDing the output signal S2 of the first delay unit 11 and a source voltage Vcc, and an inverter 15 for inverting the output signal of the NAND gate ND2. Also, the other delay units D2, D3, ..., D6 are respectively identical to the first delay unit D1 in composition.

The mirror control unit 13 includes a plurality of NAND gates ND3, ND4, ..., ND8, each of which NANDs the output signal S1 of the pulse generator 10 and a corresponding one of the output signals of the plurality of delay units D1, D2, ..., D6 in the forward delay unit 12, thereby outputting the signals which are locked, for example, the signal S4.

The backward delay unit 14 includes a plurality of delay units D7, D8, ..., D12 for sequentially delaying signals output from the mirror control unit 13. For example, the delay unit D12 includes a NAND gate ND9 and an inverter 16 to delay the output signal of the NAND gate ND8 in the mirror control unit 13, and output its delayed signal to the subsequent delay unit D11. Also, the other delay units D7, D8, ..., D11 are respectively identical to the delay unit D12 in composition.

The dummy load unit 15 includes a plurality of NAND gates ND10A, ND10B, ..., ND10F for respectively NANDing a corresponding one of the output signals of the delay units D7, D8, ..., D12 in the backward delay unit 14 and a ground voltage.

The second delay unit 16 includes inverters 17, 18 for sequentially delaying the output signal of the backward delay unit 13.

With reference to FIGS. 2A through 2G illustrating timing diagrams of respective signals in the circuit of FIG. 1, the conventional negatively delayed signal generating circuit will now be described.

The pulse generator 10 that receives the input signal CKIN shown in FIG. 2A generates the oneshot pulse signal S1 in FIG. 2B having a pulse width PW1 and delayed as much as t1 by the inverters 11, 12, and outputs the generated oneshot pulse signal S1 to the first delay unit 11 and the mirror control unit 13.

The first delay unit 11 receives the oneshot pulse signal S1 and outputs the pulse signal S2 in FIG. 2C delayed as much as t2 to the forward delay unit 12.

Then, the plurality of delay units D1, D2, ..., D6 in the forward delay unit 12 respectively, sequentially delay the output signal S2 of the first delay unit 11 as much as t3 to output the signal S2 in FIG. 2C.

When the oneshot pulse signal S1 of the pulse generator 10 and the respective output signals of the plurality of delay units D1, D2, ..., D6 are in high levels at the same time, the respective NAND gates ND3, ND4, ..., ND8 in the mirror control unit 13 respectively output a locked signal, for example, the signal S4 in FIG. 2E to the backward delay unit 14. Then, the backward delay unit 14 sequentially delays the locked signal and outputs the signal S5 in FIG. 2F to the second delay unit 16. The second delay unit 16 receives the signal S5 from the backward delay unit 14 and outputs the output signal CKO in FIG. 2G delayed as much as t4 compared to the signal S3 of the forward delay unit 12.

Therefore, the output signal CKO is converted to a locking signal during first and second cycles T1, T2 with regard to the input signal CK1, thereby becoming a negatively delayed signal slightly faster than a third pulse of the signal S1 in FIG. 2B beginning a third cycle T3.

Here, in order to generate the output signal CKO with its frequency larger than that of the input signal CKIN in the conventional negatively delayed signal generating circuit, respective rising and falling edges of the input signal CKIN need to be used. However, when the duty rate of the input signal is irregular, the duty rate of the negatively delayed signal also becomes irregular, whereby the conventional negatively delayed signal generating circuit for outputting the negatively delayed signal with its frequency larger than that of the input signal by detecting the rising and falling edges of the input signal is not applicable to a system that requires a high speed internal signal.

SUMMARY OF THE INVENTION

Accordingly, it is an object of the present invention to provide a negatively delayed signal generating circuit for compensating an input signal duty rate, wherein the negatively delayed signal is generated within two cycles of the input signal with its rising edge regarded as a reference, regardless of a duty rate of the input signal, and wherein the negatively delayed signal has a larger frequency than that of the input signal and its duty rate is close to 50%.

To achieve the above-described object, there is provided a negatively delayed signal generating circuit for compensating an input signal duty rate according to the present invention which includes a buffer for delaying an input signal and outputting a delayed signal, a forward delay unit including a pulse generator for receiving the delayed signal and generating an input pulse signal, and a plurality of delay units for sequentially delaying an output signal of the pulse generator, a latch unit for receiving the delayed signal as a first input signal, and respective output signals of the pulse generator and the plurality of delay units as second input signals, thereby outputting a plurality of latch signals, a first logic operation unit for receiving the plurality of latch signals and outputting locked latch signals, a second logic operation unit for operating the locked latch signals and the second input signals respectively delayed for more than one cycle with regard to the delayed signals, and outputting a plurality of first delay pulse signals which are locked and delayed over one cycle, a full wave backward delay unit for sequentially delaying the plurality of first delay pulse signals through the second logic operation unit, a third logic operation unit for outputting a plurality of second delay pulse signals respectively delayed for less than a half (½) cycle with regard to the locked latch signals and the delayed signals of the forward delay unit, a half wave backward delay unit for sequentially delaying the second delay pulse signals through the third logic operation unit, and a fourth logic operation unit for receiving respective output signals of the full wave backward delay unit and the half wave backward delay unit and outputting a negatively delayed signal.

The object and advantages of the present invention will become more readily apparent from the detailed description given hereinafter. However, it should be understood that the detailed description and specific example, while indicating a preferred embodiment of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein:

FIGS. 4A through 4R are timing diagrams of respective signals in the circuit of FIG. 3.

DETAILED DESCRIPTION OF THE PREFERRED EMBODIMENT

With reference to the accompanying drawings, the negatively delayed signal generating circuit for compensating an input signal duty rate according to the present invention will now be described.

Figure 3:
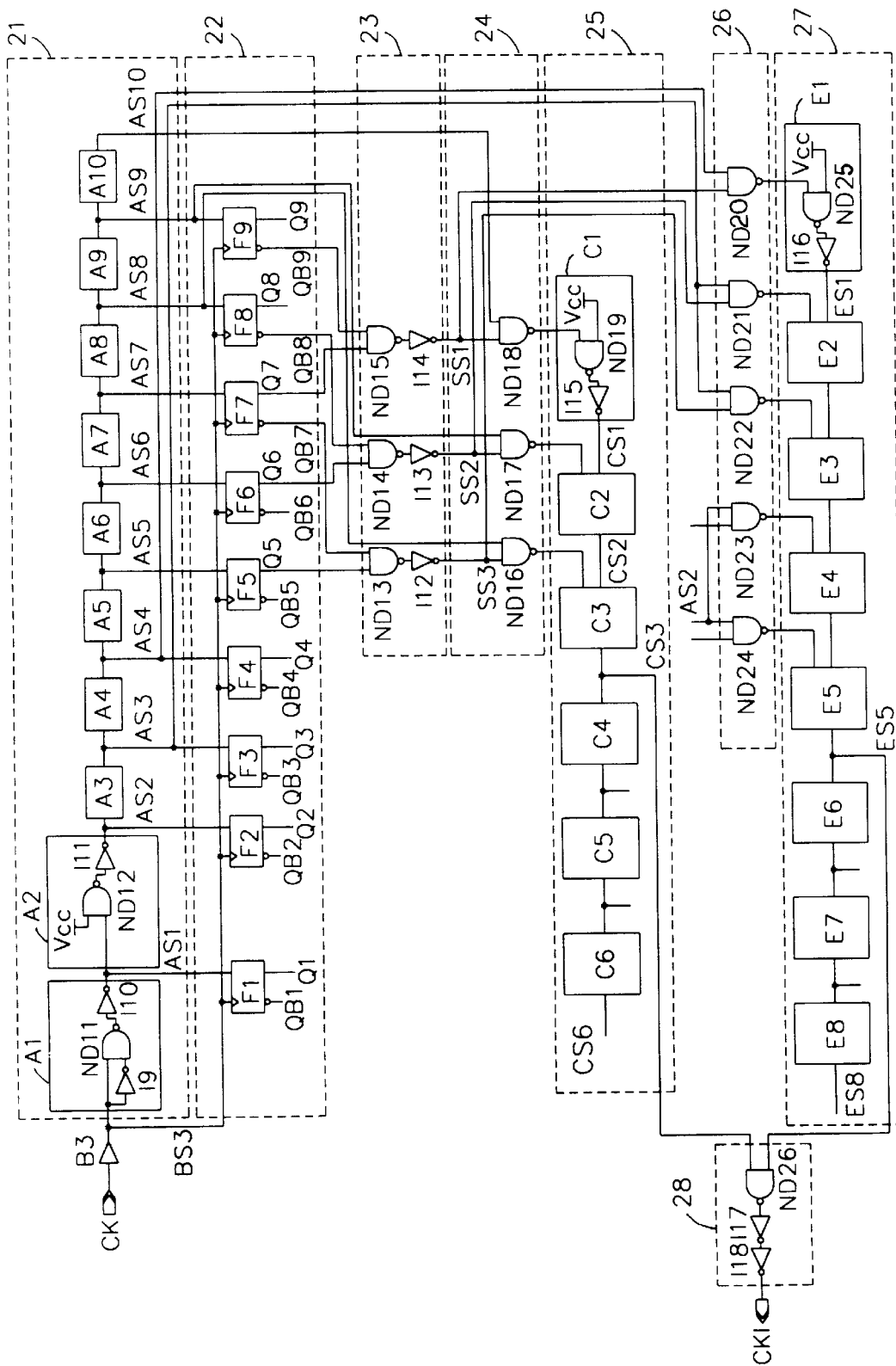
FIG. 3 is a circuit view illustrating a negatively delayed signal generating circuit according to the present invention.

FIG. 3 is a circuit view illustrating a negatively delayed signal generating circuit according to the present invention. As shown therein, the negatively delayed signal generating circuit includes a buffer B3 for delaying an input signal CK and outputting a delayed signal BS3. A forward delay unit 21 includes a pulse generator A1 for receiving the delayed signal BS3 and generating a oneshot pulse signal AS1 having a pulse width of PW2, and a plurality of delay units A2, A3, . . . , A10 for sequentially delaying the oneshot pulse signal AS1. A latch unit 22 includes a plurality of D-type flipflops Fn (n=1, 2, . . . , 9), each of which receives a corresponding one of a plurality of output signals AS1, AS2, AS3, . . . , AS9 of the forward delay unit 21 and employs the delayed signal BS3 as their synchronous signals and then outputs a corresponding one of a plurality of latch signal pairs $Q_n$, $QB_n$ (n=1, 2, . . . , 9). A first logic operation unit 23 includes NAND gates ND13, ND14, ND15 respectively connected to a corresponding one of inverters I12, I13, I14, wherein the NAND gates ND13, ND14, ND15 respectively NAND a corresponding one of the subordinate output signals $QB_n$ (n=7, 8, 9) and a corresponding one of the main output signals $Q_{n-2}$ (n=7, 8, 9) of the D-type flipflops $F_n$ (n=1, 2, . . . , 9). A second logic operation unit 24 receives a corresponding one of the output signals SS1, SS2, SS3 of the first logic operation unit 23, and a delayed oneshot pulse signal, which corresponds to the timing at a rising edge of the delayed signal BS3, among the output signals AS1, AS2, . . . , AS9 of the forward delay unit 21. A full wave backward delay unit 25 includes a plurality of delay units C1, C2, . . . , C6 for sequentially delaying the output signals of the second logic operation unit 24. A third logic operation unit 26 includes a plurality of NAND gates ND19, ND20, . . . , ND24, each of which receives a corresponding one of the output signals SS1, SS2, SS3 of the first logic operation unit 23, and a corresponding one of the delayed oneshot pulse signals AS4, AS3, AS2 which pass through the delay units in the forward delay unit 21 to correspond to a half cycle of the delayed signal BS3. A half wave backward delay unit 27 includes a plurality of delay units E1, E2, . . . , E8 for sequentially delaying the respective output signals of the third logic operation unit 26.

The respective blocks will be explained in further detail.

Figure 1:
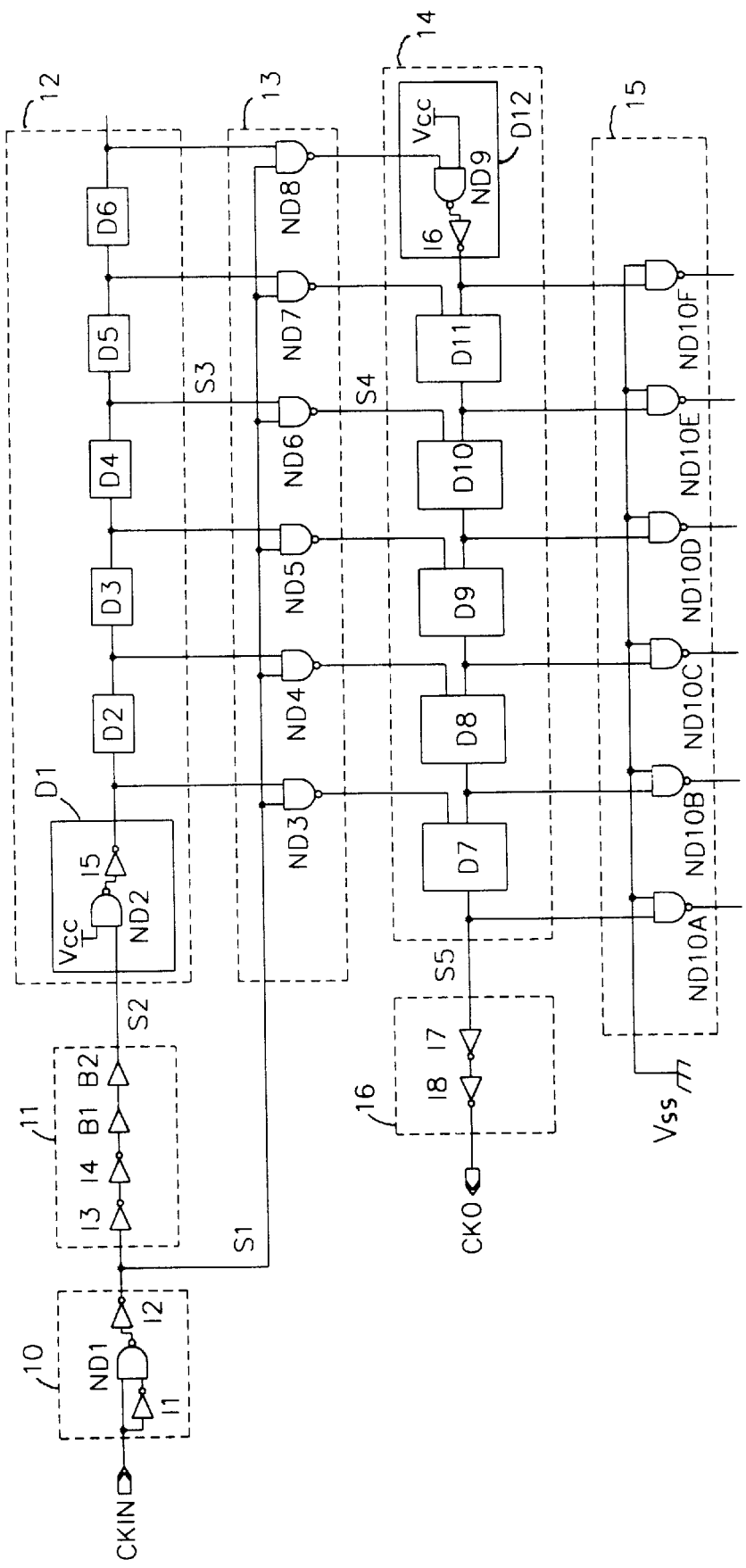
FIG. 1 is a circuit view illustrating a conventional negatively delayed signal generating circuit.
Figure 2:
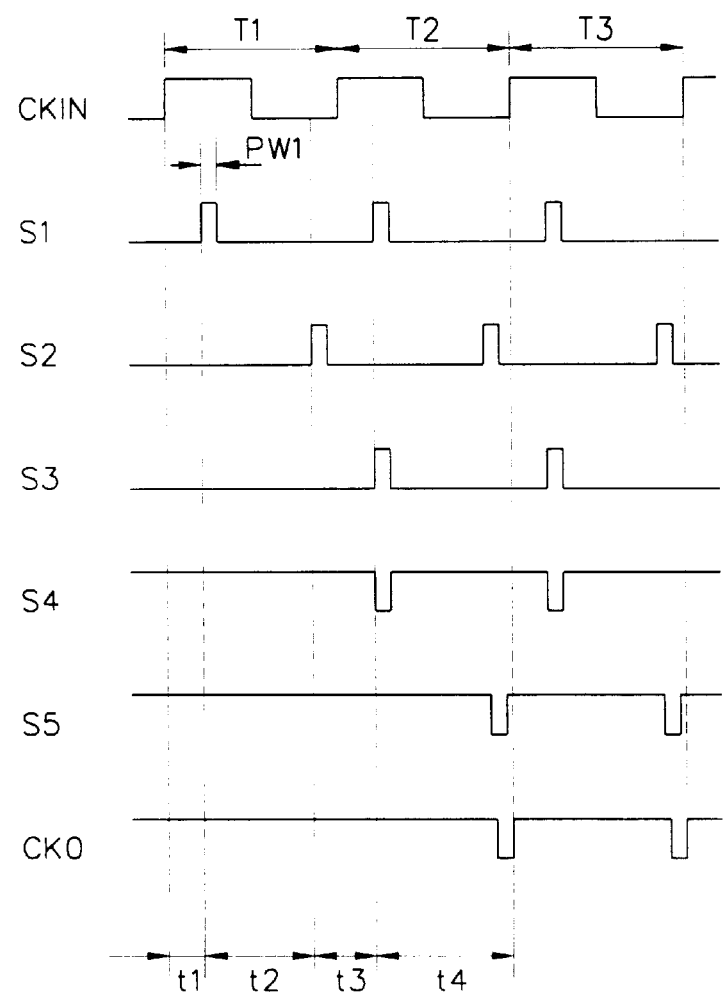
FIGS. 2A through 2G are timing diagrams of respective signals in the circuit of FIG. 1.

The pulse generator A1 and the delay units A2, A3, . . . , A10 in the forward delay unit 21 are provided with elements identical to those of the conventional pulse generator 10 and those of the delay units D1, D2, . . . , D6 in the conventional forward delay unit 11 in FIG. 1. That is, the pulse generator A1 includes inverters I9, I10 and a NAND gate ND11, and the delay unit A2, for example, in the forward delay unit 21 includes a NAND gate ND12 and an inverter I11.

The first logic operation unit 23 includes the NAND gates ND13, ND14, ND15 for respectively NANDing a corresponding one of the subordinate output signals $QB_n$ (n=7, 8, 9) and a corresponding one of the main output signals $Q_{n-2}$ (n=7, 8, 9) of the D-type flipflops $F_n$ (n=1, 2, . . . , 9), and the inverters I12, I13, I14 for correspondingly inverting the output signals of the inverters I12, I13, I14 which in turn are to output the output signals SS1, SS2. SS3.

A second logic operation unit 24 includes the NAND gates ND16, ND17, ND18 for correspondingly NANDing the output signals SS1, SS2, SS3 of the first logic operation unit 23 and the delayed oneshot pulse signals AS8, AS9, AS10 received at the rising edge of the delayed signal BS3 among the output signals of the forward delay unit 21.

A full wave backward delay unit 25 includes a plurality of delay units C1, C2, . . . , C6 for sequentially delaying the output signals of the second logic operation unit 24. Here, the delay units C1, C2, . . . , C6 are arrayed identical to the delay units An (n=2, . . . , 10) in the forward delay unit 21, and the delay unit C1 includes a NAND gate ND19 for NANDing a source voltage Vcc and an output signal of the NAND gate ND18 in the second logic operation unit 24, and the inverter I15 for delaying the output signal of the NAND gate ND19.

A third logic operation unit 26 includes a plurality of NAND gates ND20, ND21, ..., ND24 for correspondingly NANDing the output signals SS1, SS2, SS3 of the first logic operation unit 23 and the delayed oneshot pulse signals AS2, AS3, AS4 output from the forward delay unit 21 at a half cycle timing of the delayed signal BS3.

A half wave backward delay unit 27 includes a plurality of delay units E1, E2, ..., E8 for sequentially delaying the respective output signals of the third logic operation unit 26. At this time, the delay unit E1 includes the NAND gate. ND25 and the inverter 116 in the same elements as the delay units A1, A2, ..., A10 in the forward delay unit 21 and the delay units C1, C2, ..., C6 in the full wave forward delay unit 25.

A fourth logic operation unit 28 includes a NAND gate ND26 for NANDing an output signal CS3 of the full wave backward delay unit 25 and an output signal ES5 of the half wave backward delay unit 27, and inverters 117, 118 for serially delaying the output signal of the NAND gate ND26.

With reference to FIGS. 4A through 4R, the operation of the negatively delayed signal generating circuit for compensating the input signal duty rate according to the present invention will now be described.

The buffer B3, as shown in FIG. 4A, delays the input signal CK, and outputs the delayed signal BS3 in FIG. 4B to the forward delay unit 21 and to the D-type flipflops $F_n$ (n=1, 2, ..., 9) in the latch unit 22.

In the forward delay unit 21, when the pulse generator A1 generates the oneshot pulse signal AS1 having a predetermined width of PW2 shown in FIG. 4C, the delay units An (n=2, 3 ... 10) sequentially delay the oneshot pulse signal as shown in FIGS. 4D through 4I.

Here, eight oneshot pulse signals ASn (n=1, 2, ..., 8) are included within one cycle of the delayed signal BS3, whereby eight of the delay units are employed. At the same time, the latch unit 22 receives the eight oneshot pulse signals AS1, AS2, ..., AS8 and the output signal AS9 of the delay unit A9, and outputs the latch signal pairs QBn, Qn (n=1, 2, ..., 9) to the first logic operation unit 23 in accordance with the synchronous signal BS3. At this time, the first logic operation unit 23 operates the output signals of the latch unit 22 to output the signals SS1, SS2, SS3.

The output signals SS1, SS2, SS3 of the first logic operation unit 23 and the oneshot pulse signals AS8, AS9, AS10 which are delayed over one cycle of the delayed signal BS3 are correspondingly NANDed in the second logic operation unit 24, and the output signals SS1, SS2, SS3 of the first logic operation unit 23 and the oneshot pulse signals AS2, AS3, AS4 which are delayed for a half (½) cycle of the delayed signal BS3 are correspondingly operated in the third logic operation unit 26.

That is, the second logic operation unit 24 serves to output the oneshot pulse signal AS8 delayed for one cycle, and the third logic operation unit 26 serves to output the oneshot pulse signal AS4 delayed for a half (½) cycle.

The second logic operation unit 24 correspondingly NANDs the output signals SS1, SS2, SS3 of the first logic operation unit 23 and the output signals AS8, AS9, AS10 of the forward delay unit 21 to thus output the operation results to the full wave backward delay unit 25. Then, the full wave backward delay unit 25, as shown in FIGS. 4K, 4L, 4M, and 4N, sequentially delays the operation results and output the signals CS1, CS2, SC3.

The third logic operation unit 26 correspondingly NANDs the output signals SS1, SS2, SS3 of the first logic operation unit 23 and the output signals AS2, AS3, AS4 of the forward delay unit 21 to thus output the operation results to the half wave backward delay unit 27, which in turn outputs the signals ES1, ES5, ES8 as shown in FIGS. 4O, 4P and 4Q.

At this time, the output signal CS3 of the full wave backward delay unit 25 denotes an output signal further delayed by the five delay units including two delay units A9, A10 of the forward delay unit 21 and three delay units C1, C2, C3 of the full wave backward delay unit 25. This is to eliminate the influence of time delay by the buffer B3 which generates the delayed signal BS3 but to be delayed in a negative base.

Likewise, the output signal ES5 of the half wave backward delay unit 27 also employs the five delay units En (n=1, 2, ..., 5) of the half wave backward delay unit 27 in the same way as the output signal of the full wave backward delay unit 25 by the five delay units A9, A10, C1, C2, C3.

As show in FIG. 4R, the fourth logic operation unit 28 which has received the two output signals CS3, ES5 outputs the negatively delayed pulse signal CKI having a larger frequency than that of the input signal and a duty rate of 50%.

As described above, the negatively delayed signal generating circuit for compensating an input signal duty rate according to the present invention obtains a negatively delayed signal generated within two cycles of the input signal with its rising edge regarded as a reference, regardless of a duty rate of the input signal, wherein the negatively delayed signal has a larger frequency than that of the input signal and its duty rate is close to 50%, thereby being stably applicable to a semiconductor device requiring a high speed operation.

As the present invention may be embodied in several forms without departing from the spirit of essential characteristics thereof, it should also be understood that the above-described embodiment is not limited by any of the details of the foregoing description, unless otherwise specified, but rather should be construed broadly within its spirit and scope as defined in the appended claim, and therefore all changes and modifications that fall within meets and bounds of the claim, or equivalences of such meets and bounds are therefore intended to embrace the appended claim.

What is claimed is:

1. A negatively delayed signal generating circuit for compensating a duty rate of an input signal, comprising:

a buffer for delaying an input signal and outputting a delayed input signal;

a first delay unit for receiving the delayed input signal and outputting a plurality of first signals;

a latch unit for receiving the delayed input signal and the plurality of first signals and outputting a plurality of second signals, wherein each of the second signals is a pair of negative and positive signals;

a first logic unit for processing a subset of the second signals, and outputting a plurality of third signals;

a second logic unit for logically processing a first subset of the first signals and the third signals, and outputting a plurality of fourth signals;

a third logic unit for logically processing a second subset of the first signals and the third signals, and outputting a plurality of fifth signals;

a second delay unit for delaying the fourth signals and outputting a plurality of sixth signals;

a third delay unit for delaying the fifth signals and outputting a plurality of seventh signals; and a fourth logic unit for logically processing one of the sixth signals and one of the seventh signals, and outputting a negatively delayed signal.

2. The negatively delayed signal generating circuit of claim 1, wherein the first delay unit comprises:

a pulse generator for receiving the delayed input signal and generating a pulse signal; and a plurality of first delay means for sequentially delaying the pulse signal, wherein the first delay means are coupled in series.

3. The first delay unit of claim 2, wherein the pulse generator comprises:

a first logic gate for logically processing the delayed input signal;

a second logic gate for logically processing the delayed input signal and an output signal of the first logic gate; and a third logic gate for logically processing an output signal of the second logic gate.

4. The pulse generator of claim 3, wherein the first, second and third logic gate are respectively a first inverter, a NAND gate and a second inverter.

5. The first delay unit of claim 2, wherein each of the first delay means comprise:

a fourth logic gate for logically processing the pulse signal; and a fifth logic gate for logically processing an output of the fourth logic gate.

6. The first delay means of claim 5, wherein the fourth and fifth logic gate are respectively a NAND gate and an inverter.

7. The circuit of claim 1, wherein the latch unit comprises a plurality of flip-flops, wherein each of said flip-flops receives the delayed input signal and a corresponding one of the first signals, respectively.

8. The negatively delayed signal generating circuit of claim 1, wherein the first logic unit comprises:

a plurality of sixth logic gates, wherein each of sixth logic gates logically processes corresponding ones of the subset of the second signals; and a plurality of seventh logic gates, wherein each of seventh logic gates logically processes corresponding outputs of the sixth logic gates.

9. The first logic unit of claim 8, wherein the sixth and seventh logic gates are respectively NAND gates and inverters.

10. The negatively delayed signal generating circuit of claim 1, wherein the second logic unit comprises a plurality of eighth logic gates, wherein each of said eighth logic gates logically processes a corresponding one of said third signals and the first subset of the first signals delayed over one cycle with regard to the delayed input signal.

11. The second logic unit of claim 10, wherein the eighth logic gates are NAND gates.

12. The negatively delayed signal generating circuit of claim 1, wherein the second delay unit comprises a plurality of second delay means coupled in series.

13. The second delay unit of claim 12, wherein each of the second delay means comprises:

a ninth logic gate for logically processing corresponding third signals; and a tenth logic gate for logically processing an output signal of the ninth logic gate.

14. The second delay means of claim 13, wherein the ninth and tenth logic gates are respectively a NAND gate and an inverter.

15. The second delay unit of claim 12, wherein the plurality of sixth signals are negatively delayed with regard to the delayed input signal.

16. The negatively delayed signal generating circuit of claim 1, wherein the third logic unit comprises a plurality of eleventh logic gates, wherein each of eleventh logic gates logically processes corresponding ones of the second subset of the first signals and the third signals.

17. The third logic unit of claim 16, wherein the eleventh logic gates are NAND gates.

18. The third logic unit of claim 16, wherein each of the corresponding ones of the second subset of the first signals is delayed less than a half cycle with regard to the delayed input signal.

19. The negatively delayed signal generating circuit of claim 1, wherein the third delay unit comprises a plurality of third delay means coupled in series.

20. The third delay unit of claim 19, wherein each of third delay means comprises:

a twelfth logic gate for logically processing a corresponding one of fifth signals; and a thirteenth logic gate for logically processing an output signal of a corresponding one of the twelfth logic gates.

21. The third delay means of claim 20, wherein the twelfth and thirteenth logic gate are respectively a NAND gate and an inverter.

22. The negatively delayed signal generating circuit of claim 1, wherein the fourth logic unit comprises:

a fourteenth logic gate for logically processing corresponding ones of sixth signals and ones of seventh signals;

a plurality of fifteenth logic gates for logically processing an output signal of the fourteenth logic gate.

23. The fourth logic unit of claim 22, wherein the fourteenth and plurality of fifteenth logic gates are respectively a NAND gate and inverters.

24. The fourth logic unit of claim 22, wherein the negatively delayed signal has a duty rate of 50% regardless of a duty rate of the input signal.

25. The fourth logic unit of claim 16, wherein the negatively delayed signal has a higher frequency than that of the delayed input signal.

26. A negatively delayed signal generating circuit configured to compensate a duty rate of an input signal, comprising:

a latch unit that receives a plurality of first output signals from a forward delay unit that receives the input signal and generates a plurality of second output signals, wherein a predetermined relationship exists between the first output signals and the second output signals;

a first logic circuit that receives a first subset of the first output signals and a subset of the second output signals, and generates a third output signal and a plurality of fourth output signals;

a second logic circuit that receives a second subset of the first output signals and said fourth output signals, and generates a fifth output signal; and a combining circuit that receives the third output signal and the fifth output signal and generates a negatively delayed signal.

27. The negatively delayed signal generating circuit of claim 26, wherein the first logic circuit comprises:

a first logic unit that receives the subset of the second output signals and generates the fourth output signals;

a second logic unit that receives the fourth output signals and the first subset of the first output signals, and generates a plurality of second logic unit output signals; and a first delay unit that receives the second logic unit output signals and generates the third output signal.

28. The negatively delayed signal generating circuit of claim 27, wherein the second logic circuit comprises:

a third logic unit that receives the second subset of the first output signals and the fourth output signals, and generates a plurality of third logic unit output signals; and a second delay unit that receives the third logic unit output signals and generates the fifth output signal.

29. The negatively delayed signal generating circuit of claim 28, wherein the first delay unit is a full-wave backward delay unit and the second delay unit is a half-wave backward delay unit.

* * * * *